United States Patent
Shafiyan-Rad et al.

(10) Patent No.: US 10,903,128 B2
(45) Date of Patent: Jan. 26, 2021

(54) HERMETIC PACKAGE FOR POWER SEMICONDUCTOR

(71) Applicant: Microsemi Corporation, Chandler, AZ (US)

(72) Inventors: Saeed Shafiyan-Rad, Nashua, NH (US); Manuel Medeiros, III, New Bedford, MA (US); David Scott Doiron, Ashburnham, MA (US)

(73) Assignee: Microsemi Corporation, Chandler, AZ (US)

( * ) Notice: Subject to any disclaimer, the term of this patent is extended or adjusted under 35 U.S.C. 154(b) by 0 days.

(21) Appl. No.: 16/374,704

(22) Filed: Apr. 3, 2019

(65) Prior Publication Data

US 2020/0266118 A1 Aug. 20, 2020

Related U.S. Application Data

(60) Provisional application No. 62/806,573, filed on Feb. 15, 2019.

(51) Int. Cl.
*H01L 23/10* (2006.01)
*H01L 23/06* (2006.01)
(Continued)

(52) U.S. Cl.
CPC .............. *H01L 23/10* (2013.01); *H01L 23/06* (2013.01); *H01L 23/3672* (2013.01);
(Continued)

(58) Field of Classification Search
CPC . H01L 2224/48247; H01L 2224/45015; H01L 2224/48472; H01L 2924/13091;
(Continued)

(56) References Cited

U.S. PATENT DOCUMENTS 4,506,108 A 3/1985 Kersch et al.
5,247,134 A 9/1993 Beltz
(Continued)

FOREIGN PATENT DOCUMENTS

EP 0517967 B1 1/1996

OTHER PUBLICATIONS

PCT/US2019/043035, International Search Report and Written Opinion, dated Nov. 6, 2019.

*Primary Examiner* — David Chen
(74) *Attorney, Agent, or Firm* — Glass and Associates; Kenneth Glass

(57) ABSTRACT

A hermetic high-current electronic package includes a package body and a base plate hermetically coupled to the package body. A semiconductor device is thermally mounted to the base plate and has a high-current output. A high-current input/output (I/O) terminal is bonded to the high-current output of the semiconductor device by a strap terminal that is an integral high current heatsink terminal. The high-current I/O terminal passes through a hole formed in a sidewall of the package body. A ceramic seal surrounds the high-current I/O terminal and has a first surface hermetically bonded to an outer surface of the sidewall of the package body. A metal hermetic seal washer surrounds the high-current I/O terminal and is bonded to a second surface of the ceramic seal and bonded to a portion of the high-current I/O terminal that passes through the metal hermetic seal washer.

6 Claims, 3 Drawing Sheets

Package Body 10: e.g., Kovar, Alloy 42, Alloy 46, Alloy 52
I/O Terminals 22, 28: e.g., Cu, CuZr, BeCu
Braze 78, 82: e.g., CuAg
Seals 76: e.g., Al2O3, SiN
Metal Hermetic Seal Washers 80:
e.g., Kovar, Alloy 42, Alloy 46, Alloy 52

(51) Int. Cl.
   *H01L 23/00* (2006.01)
   *H01L 23/367* (2006.01)
(52) U.S. Cl.
   CPC .............. *H01L 24/09* (2013.01); *H01L 24/34* (2013.01); *H01L 24/49* (2013.01); *H01L 24/48* (2013.01); *H01L 2224/48247* (2013.01)
(58) Field of Classification Search
   CPC ... H01L 2924/181; H01L 24/48; H01L 24/49; H01L 2924/1306; H01L 24/45; H01L 24/34; H01L 2924/161–16798; H01L 2924/171–17798; H01L 23/02–10; H01L 25/04–0756; H01L 25/07–074; H01L 25/11–117
   USPC ............... 257/675, 678, 692, 693, 712, 723, 257/E23.044, E23.051, E23.052; 438/107, 121, 122, 123, 124
   See application file for complete search history.

(56) References Cited

U.S. PATENT DOCUMENTS

| | | | | |
|---|---|---|---|---|
| 5,365,108 | A | * 11/1994 | Anderson | ............. H01L 23/057 174/557 |
| 2005/0077609 | A1 | 4/2005 | Yao et al. | |
| 2005/0111798 | A1 | 5/2005 | Doiron et al. | |
| 2015/0189775 | A1 | 7/2015 | Kanchiku | |
| 2015/0287665 | A1* | 10/2015 | Hanada | ................. H01L 23/482 257/691 |
| 2016/0254203 | A1* | 9/2016 | Xiong | ............... H01L 23/49562 257/690 |

\* cited by examiner

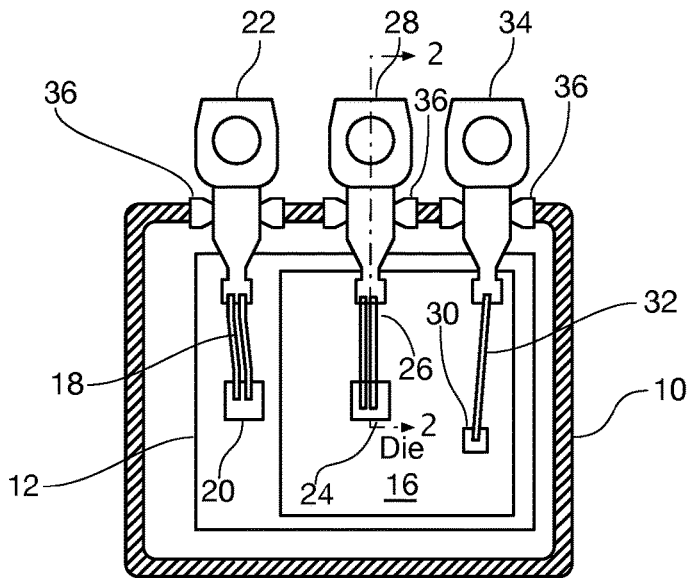
FIG. 1
(Prior Art)
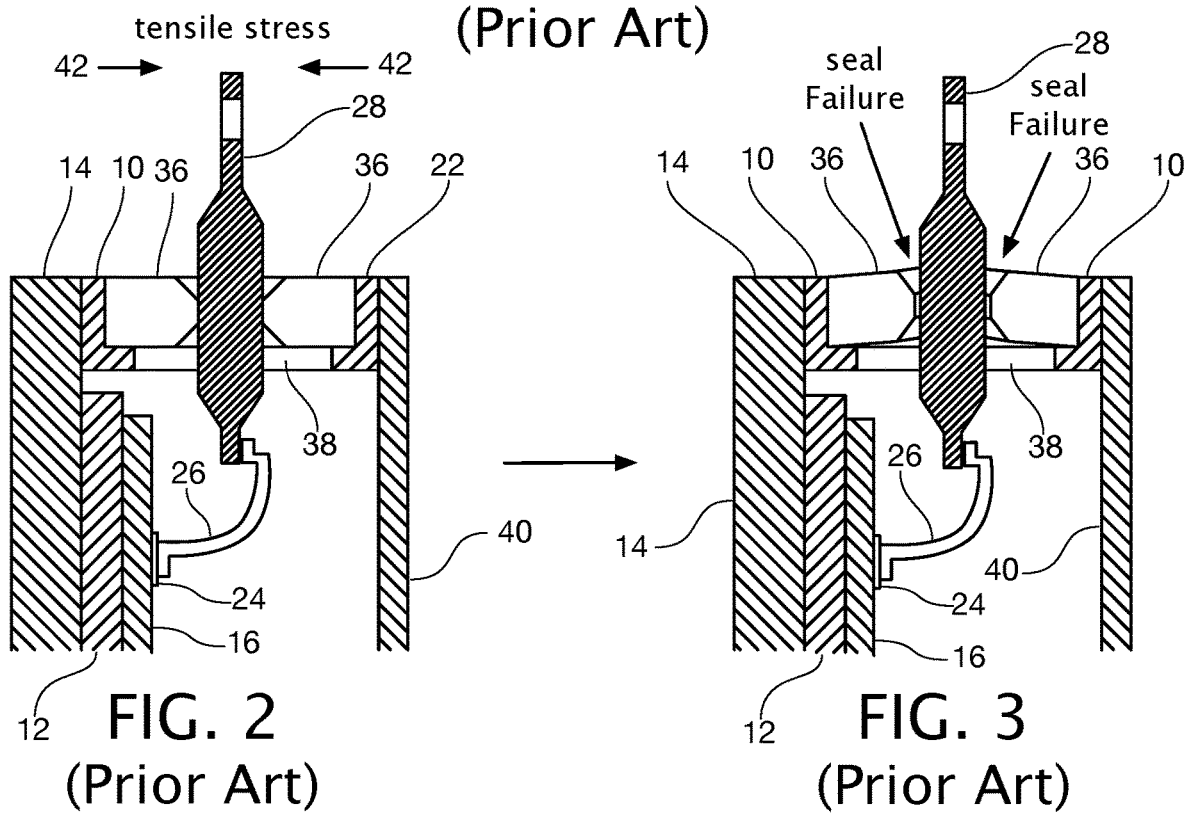
FIG. 2
(Prior Art)
FIG. 3
(Prior Art)

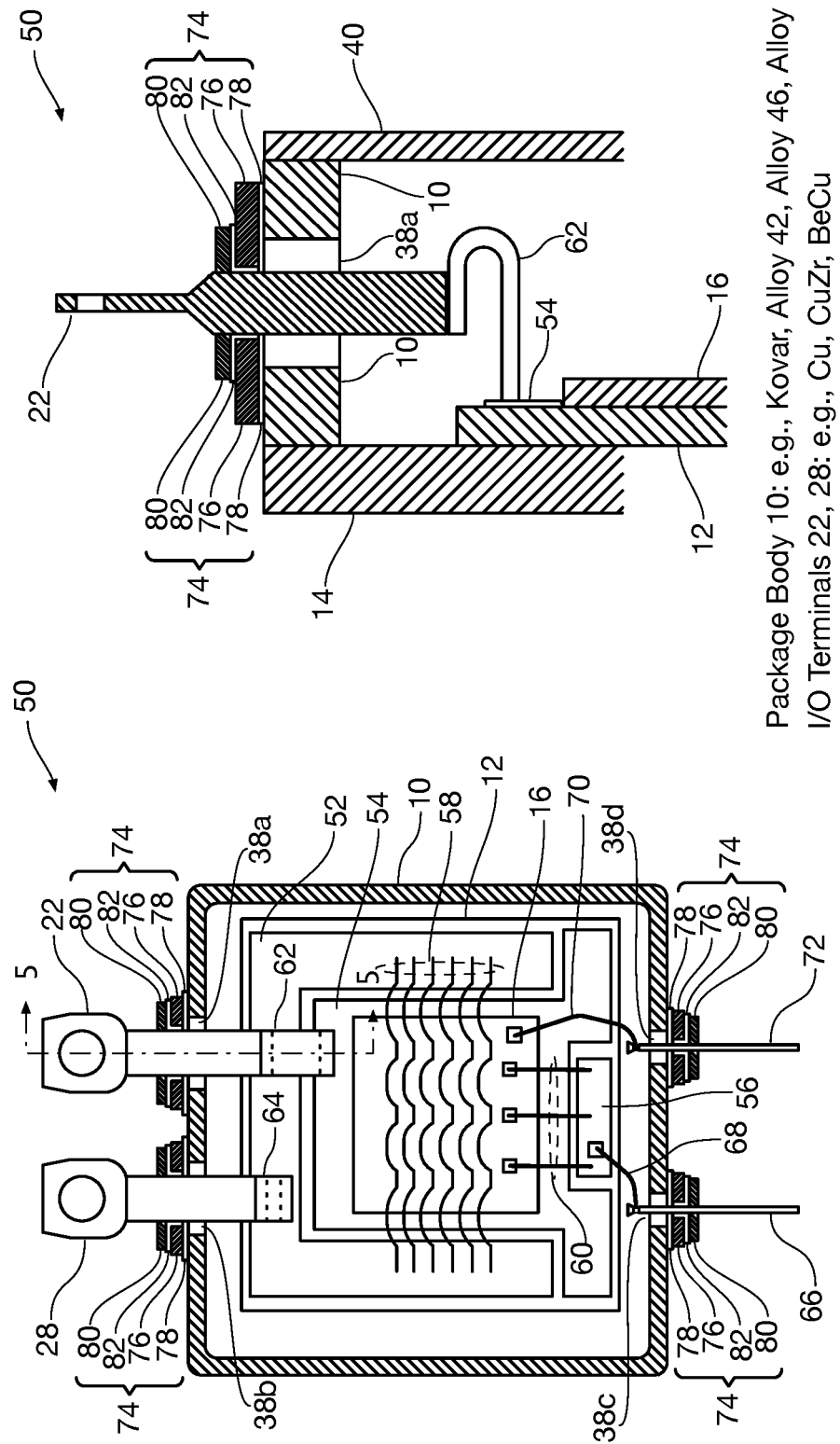

US 10,903,128 B2

HERMETIC PACKAGE FOR POWER SEMICONDUCTOR

BACKGROUND

Currently, there are packages for power semiconductors. Unfortunately such packages are not designed for high power applications. Many existing high-power devices are relatively large and heavy and not easily attachable to heat sinks. Certain applications, such as space program power components, require high current capability and must be hermetically sealed. Existing packages are also somewhat fragile allowing the seals around component leads to fracture, compromising the hermetic seal of the package. Many existing power systems are too heavy, bulky, or inefficient to meet future space mission requirements, and some cannot operate in extreme environments.

Current space-certified metal-oxide-semiconductor field-effect transistors (MOSFET), diodes, and capacitors are only capable of operating at −55 to +150° C., up to 180 V, and are built into channels of <10 kW capacity each channel having multiple MOSFET transistors. Such components are not certified for the high temperatures (300° C.) needed to minimize heat rejection radiator mass that deep-space science and human exploration missions will encounter.

Both scientific and human exploration missions require radiation-hardened, extreme-temperature components and interconnects. The driving capabilities specified for NASA missions center on extreme-temperature, radiation-hardened, high-voltage (1,200 V) components. Electric propulsion applications require a substantial increase (to >1,200 V) in voltage tolerance.

Improvements are thus needed for applications such as NASA's deep-space missions involving electric propulsion. Current operating temperature ranges, i.e. −55 to +150° C., are so narrow as to require substantial thermal management, thus increasing the specific mass of the power and propulsion system. High-voltage capability is required to manage current for high power electric thrusters. Deep-space radiation environment will rapidly degrade current components.

Among the requirements for semiconductor packages suitable for use in environments such as space, are high current handling capability in the hundreds of amps, hermetic seals meeting JANS (MIL-PRF-19500) level requirements, low inductance, low impedance, high thermal conductivity, high flexibility in terms of heatsink capability, including multiple points of thermal conduction contacts, high isolation voltage capability for space applications (high altitude and near perfect vacuum environments), light weight relative to standard commercial copper based packages, capability to meet JANS space level HiRel screening and long term reliability testing, capability to support electronics in a high radiation/harsh environments, physical ruggedness to withstand harsh conditions experienced in launch vehicles, and scalability and dimensional flexibility to accommodate different electronic technology devices such as silicon, silicon carbide and gallium nitride, without limitation.

FIG. 1 shows a top cross-sectional view of a current high-power semiconductor package with hermetic seals used in typical JANS space level packaging. FIG. 2 is a magnified side cross-sectional view of a portion of the prior-art semiconductor package of FIG. 1 taken through lines 2-2, and FIG. 3 is a magnified side cross-sectional view of a portion of the prior-art semiconductor package of FIG. 2 showing a typical hermetic seal failure mode. The type of design shown in FIGS. 1 through 3 is limited by the size of the high current pin, typically 0.060″ dia. max and by the pin material, typically copper cored Kovar® which is electrically ~10-15× more resistive then copper.

The package body 10 shown in cross section on FIG. 1 is formed from a material such as Kovar, Alloy 42, Alloy 46, or Alloy 52. A metallized substrate 12 is thermally and mechanically bonded to an inner surface of a base plate 14 which is formed from a material such as a copper tungsten alloy, molybdenum, a Cu/Mo/Cu composite, or AlSiC and is brazed to the package body 10. A semiconductor die 16 is thermally bonded to an inner surface of the metallized substrate 12. The semiconductor die 16, in the case of a power MOSFET illustrated in FIGS. 1 through 3, has its drain connection on the bottom side of the semiconductor die 16 electrically connected to the metallized substrate 12. Bonding wires 18 are connected between a bonding pad 20 on the die 16 and a high-current I/O drain terminal 22. The source of the MOSFET is connected at bonding pad 24 to a first end of bonding wires 26 and a second end of bonding wires 26 are connected to a high-current I/O source terminal 28. The gate of the MOSFET at bonding pad 30 on the die 16 is connected to a first end of bonding wire 32 and a second end of bonding wire 32 is connected to an I/O gate terminal 34.

Each of the high-current I/O terminals 22 and 28 and the gate terminal 34 communicates with the outside of the package body 10 through ceramic hermetic seals 36 that are formed in holes in the package body 10. The hole in which the high-current I/O source terminal 28 is disposed is identified in FIG. 2 by reference numeral 38. A lid 40 is seam welded to the package body 10 to hermetically seal it.

The design depicted in FIG. 1 and FIG. 2 is a rigid design and the ceramic hermetic seals 36 are susceptible to cracking during high stress and or high temperature cycling conditions and other harsh environments typically experienced in space applications. A loss of hermeticity through a typical ceramic cracking mode results from a mismatch of the thermal coefficient of expansion (CTE) with the package sidewall. The mechanical stresses (depicted by arrows 42) that can be applied between the side wall of the package body 10 and the high-current drain and source I/O terminals 22 and 28 and the I/O gate terminal 34 are easily transferred to the ceramic seal material 36, causing it to crack, resulting in hermiticity failures as depicted in FIG. 3, which is a magnified side cross-sectional view of the prior-art semiconductor package of FIG. 2 showing a typical hermetic seal failure mode.

BRIEF DESCRIPTION

According to the present invention, a semiconductor package has a low profile, low mass, and is designed to accommodate a high-power semiconductor device. According to one aspect of the invention, the semiconductor package has a capability of sourcing 200A.

The semiconductor package has a multi-level cooling points including internal terminals of the enclosed semiconductor device as well as the package base. This aspect of the invention is particularly useful when the device is employed in space because all cooling is done through conduction.

According to an aspect of the invention, a hermetic electronic package is formed in a package body. A base plate is hermetically coupled to a first end of the package body. A lid seam is welded onto the package body at a second end opposite the first end to form a hermetic seal with the package body. A substrate is thermally coupled to the base plate and has a plurality of metalized regions. A semiconductor device electrically mounted to the substrate and has a first high-current input/output terminal and a second high-current terminal. The first high-current terminal is electrically bonded to a first metalized region on the substrate and the second high-current terminal is electrically bonded to a second metalized region on the substrate by a plurality of bonding wires. A first high-current input/output (I/O) terminal passes through a hole formed in a sidewall of the package body and is electrically bonded to the first metalized region on the substrate by a first strap terminal that is an integral high current heatsink terminal. A second high-current input/output (I/O) terminal passes through a hole formed in a sidewall of the package body and is electrically bonded to the second metalized region on the substrate by a first strap terminal that is an integral high current heatsink terminal. Each of the first and second high-current I/O terminals is surrounded by a ceramic seal having a first surface and a second surface, the first surface hermetically bonded to an outer surface of the sidewall of the package body by a metal hermetic seal washer hermetically bonded to the second surface of each ceramic seal and hermetically bonded to the high-current I/O terminal which it surrounds.

According to an aspect of the invention, the package body is formed from one of Kovar, alloy 42, alloy 46 and alloy 52.

According to an aspect of the invention, the ceramic seals are formed from one of alumina and silicon nitride.

According to an aspect of the invention, the ceramic seals are brazed to the package sidewall using a CuAg braze.

According to an aspect of the invention, the high-current I/O terminals are formed from one of copper, copper zirconium, and beryllium copper (BeCu).

According to an aspect of the invention, the high-current I/O terminals serve as integral heat sink terminals.

According to an aspect of the invention, the metal hermetic seal washers are formed from one of one of Kovar, alloy 42, alloy 46 and alloy 52.

According to an aspect of the invention, the metal hermetic seal washers are hermetically bonded to second surfaces of the ceramic seals and to a portion of the high-current I/O and gate I/O terminals using a CuAg braze.

According to an aspect of the invention, a hermetic electronic package is formed in a package body. A base plate is hermetically coupled to a first end of the package body. A lid is seam welded onto the package body to form a hermetic seal with the package body. A substrate having first, second, and third metalized regions is thermally coupled to the base plate. A MOSFET semiconductor device has a drain electrically and thermally mounted to the first metalized region on the substrate, a source electrically bonded to the second metalized region on the substrate by a plurality of bonding wires, and a gate bonded to the third metalized region on the substrate by at least one bonding wire. A high-current input/output (I/O) terminal is electrically bonded to the first metalized region on the substrate by a first strap terminal that is an integral high current heatsink terminal and passes through a first hole formed in a sidewall of the package body. A source high-current I/O terminal is electrically bonded to the second metalized region on the substrate by a second strap terminal that is an integral high current heatsink terminal, the source high-current I/O terminal passing through a second hole formed in a sidewall of the package body. A gate I/O terminal is electrically bonded to the third metalized region on the substrate by a gate bonding wire. Each of the first and second high-current I/O terminals and the gate I/O terminal is surrounded by a ceramic seal having a first surface and a second surface, the first surface hermetically bonded to an outer surface of the sidewall of the package body and by a metal hermetic seal washer hermetically bonded to the second surface of each ceramic seal and hermetically bonded to the high-current I/O terminal which it surrounds.

According to an aspect of the invention, a method of fabricating a hermetic electronic package includes providing a package body, hermetically coupling a package base plate to the package body, thermally coupling a substrate to the base plate, the substrate having first, second, and third metalized regions, thermally mounting a semiconductor device to the substrate, the semiconductor device having at least one high-current output electrically bonded to the first metalized region of the substrate, bonding at least one high-current input/output (I/O) terminal to the first metalized region of the substrate by a strap terminal that is an integral high current heatsink terminal, the at least one high-current I/O terminal passing through a hole formed in a sidewall of the package body, hermetically bonding to an outer surface of the sidewall of the package body a ceramic seal surrounding the at least one high-current I/O terminal, hermetically bonding a metal hermetic seal washer surrounding the at least one high-current I/O terminal to the ceramic seal and to a portion of the at least one high-current I/O terminal that passes through the metal hermetic seal washer, and seam welding a lid onto the package body at a second end opposite the first end to form a hermetic seal with the package body.

According to an aspect of the invention, hermetically bonding the ceramic seal surrounding the at least one high-current I/O terminal to the outer surface of the sidewall of the package body comprises brazing the inner surface of the ceramic seal to the outer surface of the sidewall of the package body.

According to an aspect of the invention, hermetically bonding the metal hermetic seal washer surrounding the at least one high-current I/O terminal to the outer surface of the ceramic seal and to the portion of the at least one high-current I/O terminal that passes through the metal hermetic seal washer comprises brazing the metal hermetic seal washer to the outer surface of the ceramic seal and to the portion of the at least one high-current I/O terminal that passes through the metal hermetic seal washer. A semiconductor device is thermally mounted to the base plate and has a high-current output. A high-current input/output (I/O) terminal is bonded to the high-current output of the semiconductor device by a thermally-conductive strap that is an integral high current heatsink terminal. The high-current I/O terminal passes through a hole formed in a sidewall of the package body. A ceramic seal surrounds the high-current I/O terminal and has a first surface hermetically bonded to an outer surface of the sidewall of the package body. A metal hermetic seal washer surrounds the high-current I/O terminal and is bonded to a second surface of the ceramic seal and bonded to a portion of the high-current I/O terminal that passes through the metal hermetic seal washer.

According to an aspect of the invention, the hermetic electronic package further includes a lid seam welded onto the package body to hermetically seal it.

According to an aspect of the invention, the package body is formed from one of Kovar, alloy 42, alloy 46 and alloy 52.

According to an aspect of the invention, the ceramic seal is formed from one of alumina and silicon nitride.

According to an aspect of the invention, the ceramic seal is brazed to the package sidewall using a CuAg braze.

According to an aspect of the invention, the high-current I/O terminal is formed from one of copper, copper zirconium, and beryllium copper (BeCu).

According to an aspect of the invention, the high-current I/O terminal serves as an integral heat sink terminal.

According to an aspect of the invention, the metal hermetic seal washer is formed from one of one of Kovar, alloy 42, alloy 46 and alloy 52.

According to an aspect of the invention, the metal hermetic seal washer is hermetically bonded to a second surface of the ceramic seal and to a portion of the at least one high-current I/O terminal that passes through the metal hermetic seal washer using a CuAg braze.

BRIEF DESCRIPTION OF THE DRAWING FIGURES

The invention will be explained in more detail in the following with reference to embodiments and to the drawing in which are shown:

FIG. 1 is a top cross-sectional view of a representative prior-art semiconductor package;

FIG. 2 is a magnified side cross-sectional view of a portion of the prior-art semiconductor package of FIG. 1 taken through lines 2-2 of FIG. 1;

FIG. 3 is a magnified side cross-sectional view of the prior-art semiconductor package of FIG. 2 showing a typical hermetic seal failure mode;

FIG. 4 is a top cross-sectional view of a representative semiconductor package in accordance with the present invention;

FIG. 5 is a magnified side cross-sectional view of a portion of the semiconductor package of FIG. 4 taken through lines 5-5 of FIG. 4;

DETAILED DESCRIPTION

Figures 6, 7:
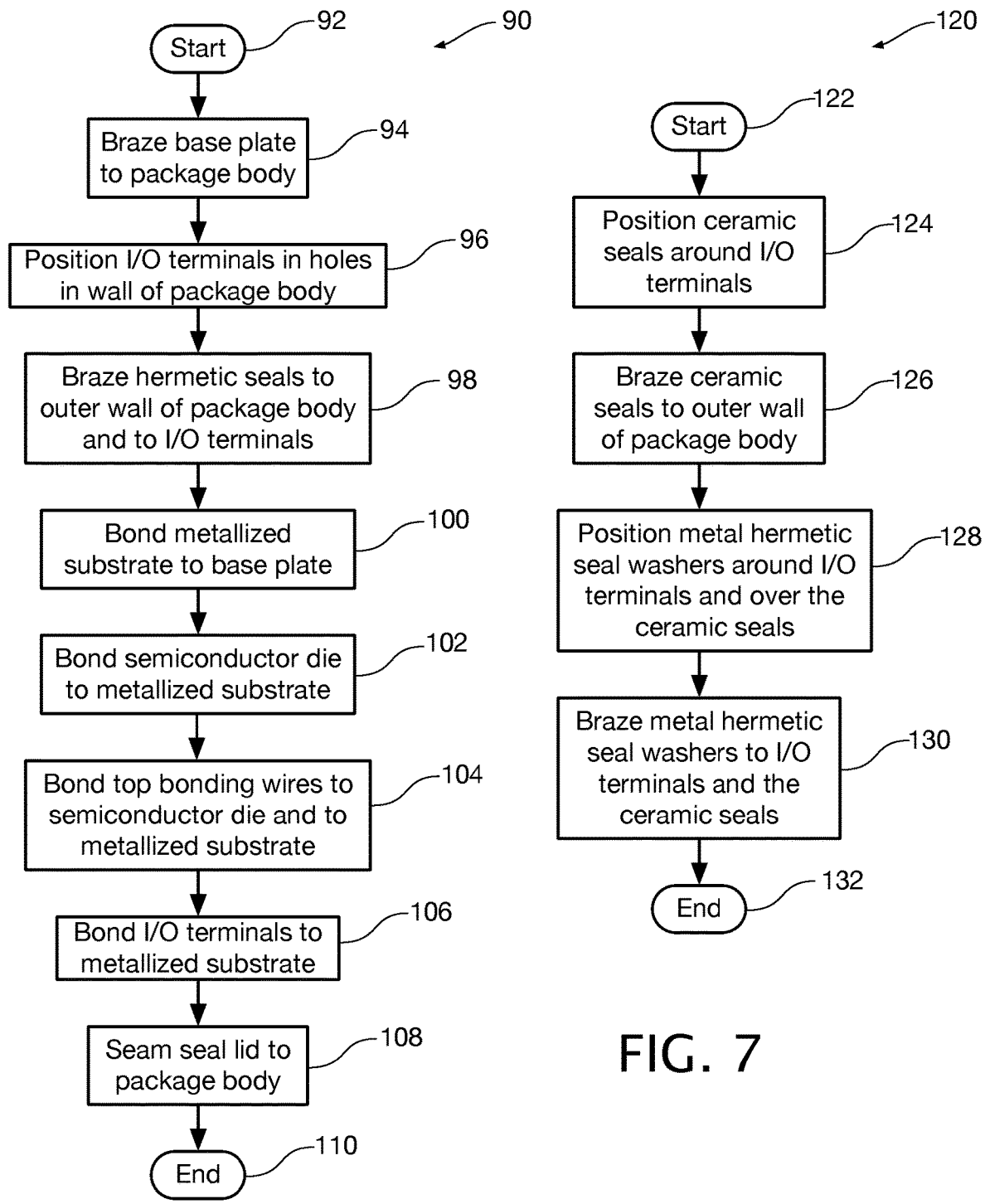
FIG. 6 is a flow diagram illustrating a method for fabricating the semiconductor package of the present invention in accordance with an aspect of the invention.
FIG. 7 is a flow diagram shows an illustrative method for brazing hermetic seals to the outer wall of the package body and to the I/O terminals.

Persons of ordinary skill in the art will realize that the following description is illustrative only and not in any way limiting. Other embodiments will readily suggest themselves to such skilled persons.

Referring to FIGS. 4 and 5, a top cross-sectional view shows a representative semiconductor package 50 in accordance with the present invention and a magnified side cross-sectional view shows a portion of the semiconductor package of FIG. 4 taken through lines 5-5 of FIG. 4. The semiconductor package 50 of FIGS. 4 and 5 include some of the same elements of the prior-art semiconductor package depicted in FIGS. 1 and 2. Those elements will be identified in FIGS. 4 and 5 using the same reference numerals that were used to identify the corresponding elements in FIGS. 1 and 2.

The semiconductor package 50 of FIGS. 4 and 5 includes a package body 10 shown in cross section in FIG. 4 that is formed from a material such as Kovar, Alloy 42, Alloy 46, or Alloy 52. A metallized substrate 12 is thermally and mechanically bonded by preform soldering it to an inner surface of a base plate 14 which is formed from a material such as a copper tungsten alloy, molybdenum, a Cu/Mo/Cu composite, or AlSiC and the base plate 14 is brazed to the package body 10 to hermetically bond and seal it to the base plate. A semiconductor die 16, in the case of a power MOSFET illustrated in FIGS. 4 and 5, has its drain connection on the bottom side of the die electrically connected to the metallized substrate 12 by preform soldering it to the metallized substrate 12. In one illustrative non-limiting embodiment of the invention, a 95Pb/5In solder may be employed.

Where a MOSFET device formed on the semiconductor die 16 is to be placed in the package 12, the metallization on the metallized substrate 12 is formed into three conductive regions 52, 54, and 56, that serve, respectively, as connection locations for source, drain, and gate terminals of the MOSFET device that is formed on the semiconductor die 16. The drain of the MOSFET device is electrically connected to the bottom side of the semiconductor die 16 which is bonded to the conductive region 54 of the metallized substrate 12 to provide both electrical and thermal connection between the semiconductor die 16 and the metallized substrate 12. The source of the MOSFET device is electrically connected to the top side of the semiconductor die 16 and is electrically connected to the conductive region 52 of the metallized substrate 12 by a plurality of bonding wires (indicated by the dashed oval lines 58) stitched between the conductive region 52 of the metallized substrate 12 and source connection points on the top side of the semiconductor die 16 in order to provide the current carrying capacity needed for the high power MOSFET device formed on the semiconductor die 16.

The gate of the MOSFET device is a geometrically distributed gate as is known in the art and is shown connected to the conductive region 56 of the metallized substrate 12 by bonding wires (indicated by the dashed oval lines 60).

The source and drain connections from the conductive regions 52 and 54 of the metallized substrate 12 are connected to the high-current I/O terminals 22 and 28, respectively, by strap terminal conductors 62 and 64. The strap terminal conductors 62 and 64 also serve as thermal conductors providing integral high current heatsink terminals to help in transferring heat from the high power MOSFET device to the outer of the package 50 and may be formed from a material such as copper, or copper zirconium and Beryllium copper (BeCu).

The conductive region 56 of the metallized substrate 12 is connected to a gate I/O terminal 66 by a bonding wire 68. A Kelvin sense wire 70 is connected to a Kelvin current sense I/O terminal 72.

Each of the high-current I/O terminals 22 and 28 and the gate and Kelvin current sense I/O terminals 66 and 72 communicates with the outside of the package body 10 through hermetic seals 74 that are bonded to an outer wall of the package body 10. The hole in which the high-current I/O terminal 22 is disposed is identified in FIG. 4 and FIG. 5 by reference numeral 38a. The hole in which the high-current I/O terminal 28 is disposed is identified in FIG. 4 by reference numeral 38b. The holes in which the gate and Kelvin current sense I/O terminals 66 and 72 are disposed are identified in FIG. 4 by reference numerals 38c and 38d, respectively. A lid 40 shown in FIG. 5 is seam welded onto the package body 10 to bond and hermetically seal it to the package body 10.

The hermetic seals 74 through which the high-current I/O terminals 22 and 28 and the gate and Kelvin current sense I/O terminals 66 and 72 are designed to match the high coefficient of thermal expansion (CTE) of the I/O terminals and internal terminals to the CTE of the package body 10 and are multi-part structures. Ceramic seals 76, which form a portion of hermetic seals 74 through which the terminals 22, 28, 66, and 72 pass, are formed from a material such as alumina or silicon nitride and a first surface of ceramic seals 76 are each attached to the outer wall of the package body 10 by a hermetic seal joint in the form of a high-temperature braze 78 of a material such as CuAg. A metal hermetic seal washer 80 formed from a material such as Kovar, Alloy 60, Alloy 46, or Alloy 52 is attached to a second surface of the ceramic seal 76 and to the I/O terminal which passes through it by a hermetic seal joint 82 in the form of a high-temperature braze of a material such as CuAg. Because of the smaller diameters of the I/O terminals 66 and 72, the maximum thermal stress occurs in the high temperature braze 78 between the ceramic seal 76 and the outer wall of the package body 10 in the smaller I/O terminals 66 and 72.

In one instance of the present invention where the high-current I/O terminals 22 and 28 are formed to a diameter of 0.125", the ceramic seal 76 may have a diameter of about 0.380" and a thickness of about 0.050", the thickness of the high temperature braze joint 78 may be about 0.010", and the metal hermetic seal washer 80 may have a diameter of about 0.250" and a thickness of about 0.020". In one instance of the present invention where the signal I/O terminals 22 and 28 are formed to a diameter of 0.040", the ceramic seal 76 may have a diameter of about 0.200" and a thickness of about 0.050", the thickness of the high temperature braze joint 78 may be about 0.010", and the metal hermetic seal washer 80 may have a diameter of about 0.150" and a thickness of about 021".

Referring now to FIG. 6, a flow diagram shows an illustrative method 90 for fabricating the semiconductor package of the present invention in accordance with an aspect of the invention. The method begins at reference numeral 92.

At reference numeral 94 the base plate is brazed to the package body. At reference numeral 96 the various I/O terminals are positioned in their respective holes in the wall of the package body. At reference numeral 98 the hermetic seals are brazed to the outer wall of the package body and to the I/O terminals. All of the aforementioned processes can be performed at a package fabrication facility.

At reference numeral 100, the metallized substrate is bonded to the package base plate by a process such as preform soldering. At reference numeral 102, semiconductor die is bonded to the metallized substrate by a process such as preform soldering.

At reference numeral 104 the top bonding wires are bonded to connection pads on the top surface of the semiconductor die and to a respective area of the metalized substrate. At reference numeral 106, the I/O terminals are bonded to the metallized substrate. At reference numeral 108, the lid is seam welded to the package body to hermetically seal the package. The method ends at reference numeral 110.

Referring now to FIG. 7, a flow diagram shows an illustrative method 120 for performing the processes shown at reference numeral 98 of FIG. 6. The method begins at reference numeral 122. At reference numeral 124 the ceramic seals are positioned around the I/O terminals. At reference numeral 126 the ceramic seals are brazed to the oute wall of the package body. At reference numeral 128 the metal hermetic seal washers are positioned over the ceramic seals and around the I/O terminals. At reference numeral 130 the metal hermetic seal washers are brazed to the I/O terminals and the ceramic seals. The method ends at reference numeral 132.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A hermetic electronic package comprising:
a package body;
a package base plate hermetically coupled to a first end of the package body;
a lid seam welded onto the package body at a second end opposite the first end to form a hermetic seal with the package body;
a substrate thermally coupled to the base plate, the substrate having first, second, and third metalized regions;
a MOSFET semiconductor device having a drain, a source, and a gate, the drain electrically and thermally mounted to the first metalized region on the substrate, the source electrically bonded to the second metalized region on the substrate by a plurality of bonding wires, and the gate bonded to the third metalized region on the substrate by at least one bonding wire;
a drain high-current input/output (I/O) terminal electrically bonded to the first metalized region on the substrate by a first strap terminal that is an integral high current heatsink terminal, the drain high-current I/O terminal passing through a hole formed in the package body;
a source high-current I/O terminal electrically bonded to the second metalized region on the substrate by a second strap terminal that is an integral high current heatsink terminal, the source high-current I/O terminal passing through a hole formed in the package body;
a gate I/O terminal electrically bonded to the third metalized region on the substrate by a gate bonding wire;
each of the drain and source high-current I/O terminals and the gate I/O terminal surrounded by a ceramic seal having a first surface and a second surface, the first surface hermetically bonded to an outer surface of the package body and by a metal hermetic seal washer hermetically bonded to the second surface of each ceramic seal and hermetically bonded to one of the drain high-current I/O terminal, the source high-current I/O terminal, and the gate I/O terminal which it surrounds.

2. The hermetic electronic package of claim 1 wherein the package body is formed from one of Kovar, alloy 42, alloy 46 and alloy 52.

3. The hermetic electronic package of claim 1 wherein the ceramic seals are formed from one of alumina and silicon nitride and are brazed to the package body using a CuAg braze.

4. The hermetic electronic package of claim 1 wherein the high-current I/O terminals are formed from one of copper, copper zirconium, and beryllium copper (BeCu).

5. The hermetic electronic package of claim 1 wherein the metal hermetic seal washer is formed from one of one of Kovar, alloy 42, alloy 46 and alloy 52.

6. The hermetic electronic package of claim 1 wherein the metal hermetic seal washers are each hermetically bonded to the second surface of the respective ceramic seal and to a portion of the respective drain high-current I/O terminal, source high-current I/O terminal and gate I/O terminal using a CuAg braze.

* * * * *